United States Patent
Kim

(10) Patent No.: US 9,318,910 B2
(45) Date of Patent: Apr. 19, 2016

(54) CELL BALANCING CIRCUIT AND CELL BALANCING METHOD USING THE SAME

(71) Applicant: Samsung SDI Co., Ltd., Yongin, Gyeonggi-do (KR)

(72) Inventor: Tae-Jin Kim, Yongin (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 394 days.

(21) Appl. No.: 13/758,383

(22) Filed: Feb. 4, 2013

(65) Prior Publication Data

US 2014/0062388 A1 Mar. 6, 2014

Related U.S. Application Data

(60) Provisional application No. 61/697,686, filed on Sep. 6, 2012.

(51) Int. Cl.
*H02J 7/00* (2006.01)
*G01R 31/36* (2006.01)

(52) U.S. Cl.
CPC .............. *H02J 7/0068* (2013.01); *H02J 7/007* (2013.01); *H02J 7/0019* (2013.01); *G01R 31/3658* (2013.01); *H02J 7/0014* (2013.01); *H02J 7/0021* (2013.01)

(58) Field of Classification Search
CPC ..... H02J 7/0011; H02J 7/0021; H02J 7/0024; H02J 7/007; G01R 31/3658; B60L 11/1861; Y02T 10/7005; Y02T 10/7044
USPC .......... 320/107, 116, 118, 119, 121, 134, 136
See application file for complete search history.

(56) References Cited

U.S. PATENT DOCUMENTS

| | | | | |
|---|---|---|---|---|
| 5,861,730 A * | 1/1999 | Lee | ................................ | 320/106 |
| 6,242,890 B1 * | 6/2001 | Sudo et al. | .................... | 320/128 |
| 6,417,646 B1 * | 7/2002 | Huykman et al. | ............ | 320/122 |
| 7,193,390 B2 * | 3/2007 | Nagai et al. | ................... | 320/116 |
| 7,400,113 B2 * | 7/2008 | Osborne | ....................... | 320/118 |
| 7,728,552 B2 * | 6/2010 | Burns | .......................... | 320/116 |

(Continued)

FOREIGN PATENT DOCUMENTS

| | | |
|---|---|---|
| DE | 10 2010 037 094 A1 | 2/2012 |
| JP | 2007-012407 A | 1/2007 |

(Continued)

OTHER PUBLICATIONS

Korean Office Action dated Mar. 26, 2014 for Korean Patent Application No. KR 10-2013-0047339 which claims priority from U.S. Appl. No. 61/697,686, filed Sep. 6, 2012, and captioned U.S. Appl. No. 13/758,383.

(Continued)

*Primary Examiner* — Helen Rossoshek
(74) *Attorney, Agent, or Firm* — Knobbe, Martens, Olson & Bear, LLP

(57) ABSTRACT

A battery cell balancing system is disclosed. In one embodiment, the system includes a plurality of battery cells arranged in series and a power supply configured to receive the cumulative voltage of the battery cells and output a first charging voltage to one of the battery cells that has a voltage less than a reference voltage. According to one embodiment, it is possible to implement a cell balancing operation using the cumulative voltage of the battery cells.

20 Claims, 2 Drawing Sheets

(56) References Cited

U.S. PATENT DOCUMENTS

| | | | | |
|---|---|---|---|---|
| 7,728,553 | B2* | 6/2010 | Carrier | H01M 2/1022 320/116 |
| 7,825,629 | B2* | 11/2010 | Studyvin et al. | 320/122 |
| 7,928,691 | B2* | 4/2011 | Studyvin et al. | 320/116 |
| 7,973,511 | B2* | 7/2011 | Choksi et al. | 320/106 |
| 8,058,842 | B2* | 11/2011 | Kai | B60L 11/1861 320/116 |
| 8,103,401 | B2* | 1/2012 | Kubo et al. | 701/34.1 |
| 8,134,338 | B2* | 3/2012 | Choi | 320/134 |
| 8,212,522 | B2* | 7/2012 | Deal et al. | 320/116 |
| 8,264,204 | B2* | 9/2012 | Nagaoka et al. | 320/136 |
| 8,410,756 | B2* | 4/2013 | Sakakibara et al. | 320/118 |
| 8,513,918 | B2* | 8/2013 | Ueda | H02J 7/0016 320/116 |
| 8,513,922 | B2* | 8/2013 | Yang et al. | 320/152 |
| 8,541,979 | B2* | 9/2013 | Firehammer et al. | 320/118 |
| 8,692,508 | B2* | 4/2014 | Shimizu | H02J 7/0016 320/103 |
| 8,698,459 | B2* | 4/2014 | Kim | 320/136 |
| 8,806,240 | B2* | 8/2014 | Kim et al. | 713/310 |
| 8,808,886 | B2* | 8/2014 | Kim | 429/61 |
| 8,829,854 | B2* | 9/2014 | Park | 320/118 |
| 8,860,423 | B2* | 10/2014 | Miyamoto | 324/433 |
| 8,896,273 | B2* | 11/2014 | Miyazaki | H02J 7/0026 320/116 |
| 8,896,315 | B1* | 11/2014 | Davies | 324/434 |
| 8,963,499 | B2* | 2/2015 | Choi | 320/118 |
| 8,994,335 | B2* | 3/2015 | Tagami | H02J 7/0024 320/118 |
| 9,000,726 | B2* | 4/2015 | Sakurai | H02J 7/0016 320/118 |
| 9,112,370 | B2* | 8/2015 | Yen | H02J 7/007 |
| 2004/0135544 | A1* | 7/2004 | King et al. | 320/116 |
| 2004/0135546 | A1 | 7/2004 | Chertok et al. | |
| 2005/0110464 | A1* | 5/2005 | Baker | G01R 31/3658 320/134 |
| 2005/0140335 | A1 | 6/2005 | Lee et al. | |
| 2006/0071643 | A1* | 4/2006 | Carrier | H01M 10/4257 320/132 |
| 2008/0050645 | A1* | 2/2008 | Kai | B60L 11/1861 429/61 |
| 2008/0074082 | A1* | 3/2008 | Tae et al. | 320/136 |
| 2008/0309288 | A1* | 12/2008 | Benckenstein et al. | 320/119 |
| 2011/0037427 | A1* | 2/2011 | Boncyk | B64G 1/425 320/107 |
| 2011/0115436 | A1 | 5/2011 | Zhang et al. | |
| 2011/0193525 | A1* | 8/2011 | Ro | 320/116 |
| 2012/0086390 | A1 | 4/2012 | Lim et al. | |
| 2012/0249055 | A1* | 10/2012 | Wade | 320/107 |
| 2012/0306449 | A1* | 12/2012 | Tagami | H02J 7/0024 320/118 |
| 2012/0313439 | A1* | 12/2012 | Yamaguchi | H01M 10/425 307/71 |
| 2013/0113280 | A1* | 5/2013 | Yang et al. | 307/19 |
| 2013/0207616 | A1* | 8/2013 | Shim | 320/136 |
| 2013/0249493 | A1* | 9/2013 | Kim et al. | 320/134 |
| 2013/0257383 | A1* | 10/2013 | Shim | H02J 3/32 320/134 |
| 2014/0015495 | A1* | 1/2014 | Woo | 320/160 |
| 2014/0042974 | A1* | 2/2014 | Yang | H01M 10/441 320/119 |
| 2014/0062387 | A1* | 3/2014 | Kim | 320/107 |
| 2014/0145678 | A1* | 5/2014 | Hwang | 320/118 |
| 2014/0217982 | A1* | 8/2014 | Ohkawa | H02J 7/0016 320/118 |
| 2014/0232344 | A1* | 8/2014 | Drobnik | H02J 7/007 320/118 |
| 2014/0312828 | A1* | 10/2014 | Vo et al. | 320/103 |
| 2014/0340047 | A1* | 11/2014 | Weissenborn | H02J 7/0024 320/135 |
| 2015/0024240 | A1* | 1/2015 | Seubert | H02J 7/0065 429/50 |
| 2015/0037656 | A1* | 2/2015 | Noda et al. | 429/149 |

FOREIGN PATENT DOCUMENTS

| | | |
|---|---|---|
| KR | 10-2006-0083343 A | 7/2006 |
| KR | 10-0878941 B1 | 1/2009 |
| KR | 10-2010-0093464 A | 8/2010 |
| KR | 10-2012-0016993 A | 2/2012 |

OTHER PUBLICATIONS

Extended European Search Report dated Jan. 30, 2015 for European Patent Application No. EP 13 182 621.6 which claims priority from U.S. Appl. No. 61/697,686, filed Sep. 6, 2012, and captioned U.S. Appl. No. 13/758,383.

Korean Notice of Allowance dated Nov. 26, 2014 for Korean Patent Application No. KR 10-2013-0047339 which claims priority from U.S. Appl. No. 61/697,686, filed Sep. 6, 2012, and captioned U.S. Appl. No. 13/758,383.

* cited by examiner

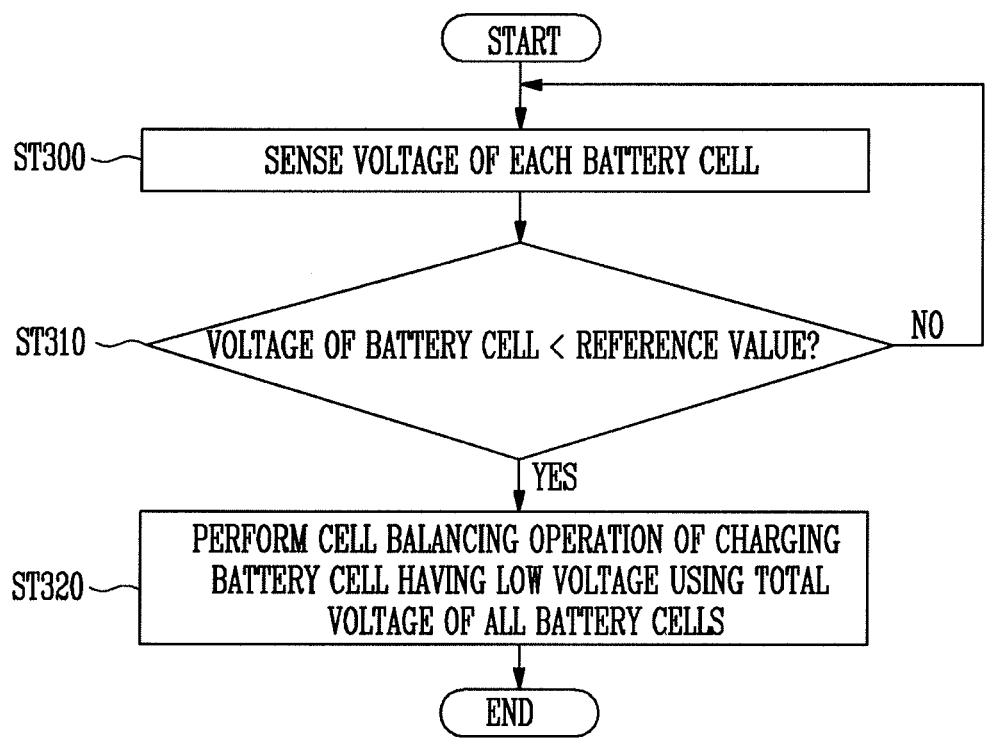

CELL BALANCING CIRCUIT AND CELL BALANCING METHOD USING THE SAME

CROSS-REFERENCE TO RELATED APPLICATIONS

This application claims priority to U.S. Provisional No. 61/697,686 titled "CELL BALANCING CIRCUIT AND BALANCING METHOD THEREOF" filed Sep. 6, 2012, which is hereby incorporated by reference in its entirety.

BACKGROUND

1. Field

The described technology generally relates to an active cell balancing circuit and a cell balancing method using the same.

2. Description of the Related Technology

Studies on rechargeable batteries have been actively conducted with the development of portable electronic devices such as a cellular phone and a notebook computer. Particularly, various kinds of secondary batteries have been developed, such as a nickel-cadmium battery, a lead storage battery, a nickel metal hydride (NiMH) battery, a lithium polymer battery, a metal lithium battery and a zinc-air storage battery. Such a secondary battery is generally combined with a circuit so as to constitute a battery pack, and charging and discharging are performed through an external terminal of the battery pack.

A battery pack generally includes battery cells and a peripheral circuit having a charging/discharging circuit. The peripheral circuit is generally manufactured as a printed circuit board and then coupled to the battery cells. If an external power source is connected to the battery pack through an external terminal of the battery pack, the battery cells are charged by external power supplied through the external terminal and the charging/discharging circuit. If a load is connected to the battery pack through the external terminal, the operation is performed, in which the power of the battery cells is supplied to the load through the charging/discharging circuit and the external terminal. In this case, the charging/discharging circuit controls the charging/discharging of the battery cells between the external terminal and the battery cell. Generally, a plurality of battery cells are connected in series and parallel so as to be suitable for the consumption capacity of the load.

SUMMARY

One inventive aspect is a cell balancing circuit and a cell balancing method using the same that has an isolation power supply for receiving the total voltage of a plurality of battery cells connected in series, in which a charging voltage is applied to a battery cell having a voltage lower than a reference value through the isolation power supply, so that it is possible to use 100% of the capacity of the battery cell.

Another aspect is a cell balancing circuit, including: a plurality of battery cells coupled in series; pairs of switches respectively connected to (+) and (−) terminals of the battery cells; an isolation power supply that receives the total voltage of the battery cells, applied through an input stage, and has an output stage coupled to the pair of switches; and a controller that controls turn-on/off of the pair of switches and an operation of the isolation power supply.

The pair of switches coupled to each battery cell may be independently operated, and may be separated from each other for each battery cell.

Two switches constituting the pair of switches may be simultaneously turned on/off.

The controller performs an operation of measuring a voltage of each battery cell corresponding to the pair of switches by individually controlling the pair of switches, and comparing the measured voltage of each battery cell with a predetermined reference value.

A control switch may be further provided between a (+) terminal of all the battery cells coupled in series and a (+) terminal at the input stage of the isolation power supply.

The isolation power supply may receive the total voltage of the battery cells, applied to the input stage thereof, and adjust the turn ratio of a transformer provided in the isolation power supply or control a switching time through a power controller provided in the isolation power supply. Accordingly, the isolation power supply converts the input total voltage into a predetermined voltage and provides the converted predetermined voltage to a corresponding battery cell coupled to the output stage.

A charger may be further provided between the isolation power supply and the pair of switches.

The charger may be implemented as a DC/DC converter. The charger may receive a voltage output from the isolation power supply as an input voltage, convert the received voltage into a voltage suitable for a battery cell that requires charging, and output the converted voltage as an output voltage.

A first ground voltage coupled to a (−) terminal of all the battery cells and a second ground voltage coupled to a (−) terminal at the output stage of the isolation power supply are different voltages physically separated from each other.

Another aspect is a cell balancing method, including: sensing a voltage of each battery cell by sequentially turning on pairs of switches respectively coupled to (+) and (−) terminals of a plurality of battery cells coupled in series; and transferring the measured voltage of each battery cell to a controller so as to be compared with a predetermined reference value, and performing a cell balancing operation of applying a charging voltage to a specific battery cell when the voltage of the battery cell is lower than the reference value, wherein the cell balancing operation is implemented by charging the battery cell having a low voltage using the total voltage of the battery cells.

The cell balancing operation may be operated by applying the charging voltage to the battery cell having a voltage lower than the reference value using an isolation power supply.

The sensing of the voltage of each battery cell may be implemented by sequentially turning on the pairs of switches using the controller during a voltage measuring period.

The pair of switches corresponding to the battery cell having the voltage lower than the reference value may be turned on so that the (+) and (−) terminals of the battery cell are coupled to an output stage of the isolation power supply, thereby applying the charging voltage output from the isolation power supply to the battery cell.

While the cell balancing operation is performed in which the charging voltage is applied to the battery cell, all the switches coupled to the other battery cells may be turned off.

The cell balancing operation may be performed by applying an enable signal from the controller to the isolation power supply.

Another aspect is a battery cell balancing system, comprising: a plurality of battery cells arranged in series; and a power supply configured to receive the cumulative voltage of the battery cells and output a first charging voltage to one of the battery cells that has a voltage less than a reference voltage.

The above system further comprises a plurality of pairs of switches each switch pair respectively connected to the positive and negative terminals of each of the battery cells, wherein each switch pair is configured to be selectively turned on, and wherein the power supply is further configured to provide the first charging voltage to the battery cell via the turned-on switch pair. In the above system, each switch pair is separated from the remaining pairs of switches.

In the above system, the battery cells have a positive end terminal and a negative end terminal disposed on opposing ends thereof, respectively, and wherein the power supply comprises 1) first and second input terminals respectively connected to the positive and negative end terminals and 2) an output terminal electrically connected to the switches.

The above system further comprises a control switch disposed between 1) one of the positive and negative end terminals and 2) one of the first and second input terminals of the power supply. The above system further comprises a charger electrically connected to the switches and the output terminal of the power supply, wherein the charger is configured to receive the first charging voltage from the power supply and convert the received voltage into a second charging voltage.

In the above system, the first charging voltage is greater than the second charging voltage. The above system further comprises: a first ground voltage source electrically connected to the negative end terminal of the battery cells; and a second ground voltage source different from the first ground voltage source and electrically connected to the output terminal of the power supply. In the above system, the power supply further comprises a coil-type transformer, and wherein the power supply is configured to adjust the turn ratio of the transformer such that the received voltage is converted into the first charging voltage.

The above system further comprises a controller configured to determine the battery cell that has a voltage less than the reference voltage and control the switches such that the pair of switches coupled to the positive and negative terminals of the determined battery cell are turned on and the remaining switches are turned off. In the above system, the controller is further configured to measure voltages of the battery cells and compare the measured voltages with the reference voltage which has been previously stored in order to determine the under voltage battery cell.

In the above system, the controller is further configured to simultaneously turn on and turn off each of the pairs of the switches. In the above system, the controller is further configured to independently operate each pair of the switches from the remaining pairs of the switches. In the above system, the controller is further configured to provide an enable signal to the power supply such that the power supply outputs the first charging voltage only while receiving the enable signal. In the above system, the power supply is configured to output the charging voltage at least until the at least one battery cell is charged with the reference voltage.

Another aspect is a battery pack voltage balancer, comprising: a plurality of pairs of switches each pair respectively connected to the positive and negative terminals of each of a plurality of battery cells within a battery pack, wherein each pair of the switches is configured to be selectively turned on; and a power supply configured to receive the cumulative voltage of the battery cells and provide a first charging voltage to one of the battery cells that has a voltage less than a reference voltage via the turned-on pair of switches.

The above balancer further comprises a controller configured to determine the battery cell that has a voltage less than the reference voltage and control the switches such that the pair of switches coupled to the positive and negative terminals of the determined battery cell are turned on and the remaining switches are turned off.

Another aspect is a battery cell balancing method, comprising: receiving the cumulative voltage of a plurality of battery cells coupled in series; converting the received voltage to a first charging voltage; and providing the first charging voltage to one of the battery cells that has a voltage less than a reference voltage.

The above method further comprises: measuring a voltage of each of the battery cells; comparing the measured voltages with a previously stored reference voltage; and determining the low voltage battery cell based on the comparing. The above method further comprises: providing a plurality of pairs of switches each switch pair respectively coupled to the battery cells and sequentially turning on the pairs of the switches, wherein the measuring is performed while the switches are turned on.

BRIEF DESCRIPTION OF THE DRAWINGS

FIG. 3 is a flowchart illustrating a cell balancing method according to an embodiment.

DETAILED DESCRIPTION

Figure 1:
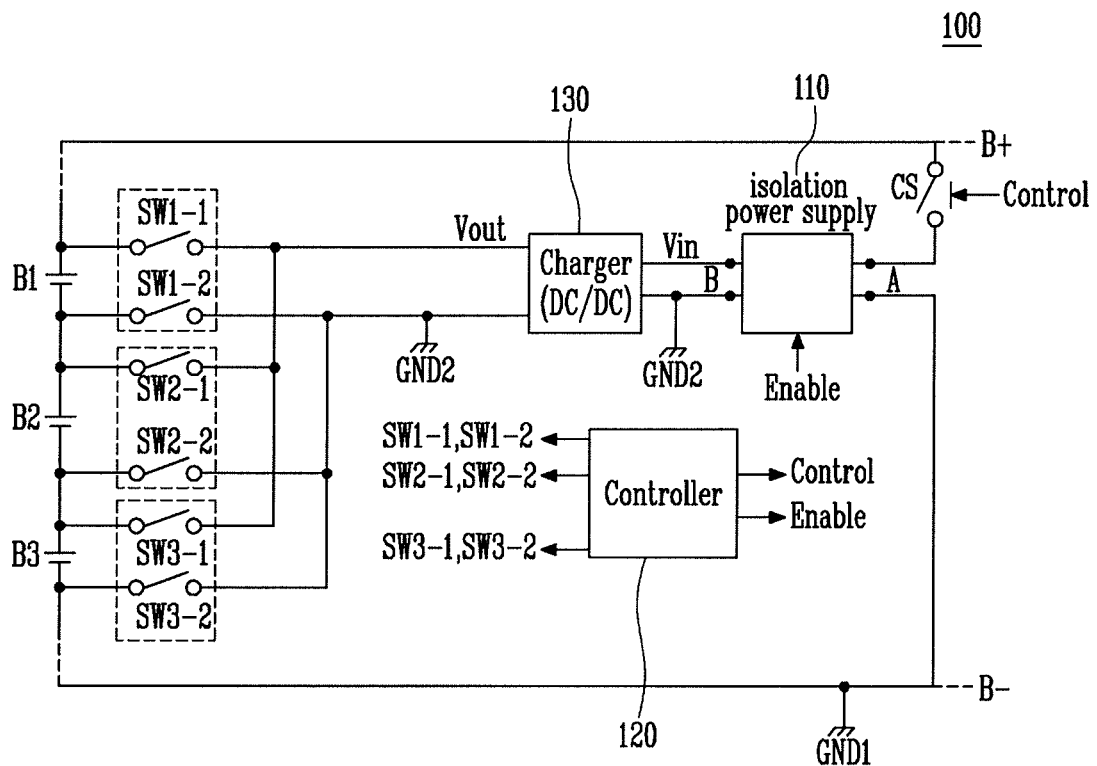
FIG. 1 is a circuit diagram illustrating a cell balancing circuit according to an embodiment.

Generally, capacity variation between battery cells constituting a battery pack exists due to various reasons in the manufacturing process of battery cells. Therefore, a difference in charging/discharging voltages between the battery cells occurs during a charging/discharging cycle. Accordingly, a specific battery cell may be overcharged during the charging process of the battery pack or may be overdischarged during the discharging period. The overcharging or overdischarging of the specific battery cell decreases the capacity of the battery pack. In addition, the overcharging or overdischarging of the specific battery cell degrades the battery pack and reduce the battery lifetime. Thus, a battery monitoring unit generally has a balancing circuit for minimizing a difference in voltages between a plurality of battery cells connected in series.

That is, the battery monitoring unit senses the voltage of each battery cell, and performs cell balancing that allows voltages of all the battery cells to be equalized by forcibly discharging a battery cell having a relatively high voltage when the difference in voltage between the battery cells is a reference value or more. However, in such passive cell balancing, a resistor consumes some power during the forcible discharging. Therefore, 100% of the capacity of the battery cell is not used, and a portion of the capacity of the battery cells is consumed as heat.

Hereinafter, embodiments will be described with reference to the accompanying drawings. Here, when a first element is described as being coupled to a second element, the first element may be not only directly coupled to the second element but may also be indirectly coupled to the second element via a third element. Further, some of the elements that are not relevant to the disclosed embodiments are omitted for clarity. Also, like reference numerals refer to like elements throughout.

Figure 2:
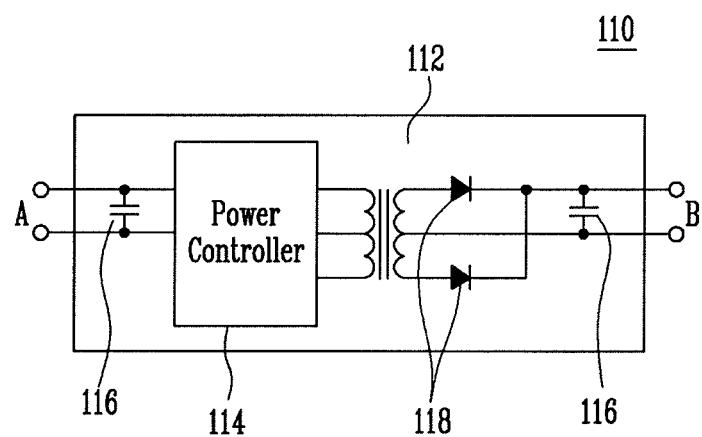
FIG. 2 is a circuit diagram illustrating an embodiment of an isolation power supply shown in FIG. 1.

FIG. 1 is a circuit diagram illustrating a cell balancing circuit according to an embodiment. FIG. 2 is a circuit diagram illustrating an embodiment of an isolation power supply shown in FIG. 1.

Referring to FIG. 1, the cell balancing circuit 100 includes a plurality of battery cells B1, B2 and B3 coupled in series and pairs of switches SW1-1 and SW1-2, SW2-1 and SW2-2, and SW3-1 and SW3-2 respectively connected to (+) and (−) terminals of the battery cells. The cell balancing circuit 100 also includes an isolation power supply (or power supply) 110 that receives the total voltage of the battery cells, applied through an input stage A, and has an output stage B coupled to the pair of switches and a controller 120 that controls turn-on/off of the pair of switches and an operation of the isolation power supply 110.

Although three battery cells B1, B2 and B3 coupled in series and three pairs of switches SW1-1 and SW1-2, SW2-1 and SW2-2, and SW3-1 and SW3-2 are illustrated in the FIG. 1 embodiment, the number of the battery cells and switches are not limited thereto.

In this embodiment, the switch coupled to each battery cell is implemented as a pair of switches. Referring to FIG. 1, a (1-1)th switch SW1-1 is coupled to the (+) terminal of the first battery cell B1, and a (1-2)th switch SW1-2 is coupled to the (−) terminal of the first battery cell B1.

Similarly, a (2-1)th switch SW2-1 is coupled to the (+) terminal of the second battery cell B2, and a (2-2)th switch SW2-2 is coupled to the (−) terminal of the second battery cell B2. A (3-1)th switch SW3-1 is coupled to the (+) terminal of the third battery cell B3, and a (3-2)th switch SW3-2 is coupled to the (−) terminal of the third battery cell B3.

Here, the switches may be implemented as relays, photo MOS relays, photo couplers, or the like.

Since the first to third battery cells B1 to B3 are coupled in series, the (1-2)th switch SW1-2 and the (2-1)th switch SW2-1 coupled to the portion at which the first and second battery cells B1 and B2 are coupled to each other are coupled to the same node (see the node between the first battery cell B1 and the second battery cell B2).

Similarly, the (2-2)th switch SW2-2 and the (3-1)th switch SW3-1 coupled to the portion at which the second and third battery cells B2 and B3 are coupled to each other are coupled to the same node (see the node between the second battery cell B2 and the third battery cell B3).

In one embodiment, the pairs of switches respectively coupled to the battery cells are independently operated. Thus, in this embodiment, although adjacent switches are coupled to the same node, the switches are separated from each other for each battery cell.

In one embodiment, the (1-1)th switch SW1-1 and the (1-2)th switch SW1-2, which are a pair of switches corresponding to the first battery cell B1, are simultaneously turned on/off. The switches SW1-1 and SW1-2 may be simultaneously turned on, and thus can perform a function of sensing a voltage of the first battery cell B1 or providing a charging voltage to the first battery cell B1 by being coupled to the output stage of the isolation power supply 110.

In one embodiment, the (2-1)th and (2-2)th switches SW2-1 and SW2-2 corresponding to the second battery cell B2 and the (3-1)th and (3-2)th switches SW3-1 and SW3-2 corresponding to the third battery cell B3 perform the same operation as the switches SW1-1 and SW1-2.

In one embodiment, the controller 120 individually controls the switches SW1-1 and SW1-2, SW2-1 and SW2-2, or SW3-1 and SW3-2, so as to measure a voltage of each battery cell B1, B2 or B3 corresponding to the pair of switches. In one embodiment, if the controller 120 determines a battery cell having a voltage lower than a reference value based on the measured voltage, the controller 120 controls the pair of switches coupled to the battery cell to be turned on so that the charging voltage is applied to the battery cell. Accordingly, the battery cell connected to the turned-on switches is coupled to the isolation power supply 110. The reference value may be stored in the controller 120 or a separate memory (not shown). The reference value may be modified depending factors including, but not limited thereto, battery capacity, battery type, the number of batteries or type of external devices to which the battery cells supply power.

Here, the voltage measurement of each battery cell may be implemented by sequentially turning on the pairs of switches coupled to the respective battery cells.

In one embodiment, the controller 120 receives the measured voltage of each battery cell and compares it with a predetermined reference value. In a case where the voltage of a specific battery cell is lower than the reference value, the controller 120 may perform a cell balancing operation in which the charging voltage is applied to the battery cell during the voltage measuring period. In another embodiment, the controller 120 measures the voltage of each battery cell, compares it with a predetermined reference value and performs the cell balancing.

For example, in a case where the voltage of the first battery cell B1 is lower than the reference value, the (1-1)th and (1-2)th switches SW1-1 and SW1-2 are turned on so that the (+) and (−) terminals of the first battery cell B1 are coupled to the output terminal (see "B" in FIG. 1) of the isolation power supply 110. Accordingly, the charging voltage output from the isolation power supply 110 is applied to the first battery cell B1.

In one embodiment, while the cell balancing operation is performed in which the charging voltage is applied to the first battery cell B1, all the switches coupled to the second and third battery cells B2 and B3 are turned off so that the charging voltage is not applied to the other battery cells B2 and B3.

According to one embodiment, the cell balancing circuit 100 has the isolation power supply 110 that receives the total voltage (or cumulative voltage) of the battery cells coupled in series, and the charging voltage is applied to the battery cell having a voltage lower than the reference value through the isolation power supply 110, thereby implementing the cell balancing operation using the total voltage of the battery cells. Further, there is no heat consumption caused through forcible discharging, and thus it is possible to use 100% of the capacity of the battery cells.

In this case, the cell balancing operation can be performed by applying an enable signal Enable from the controller 120 to the isolation power supply 110. That is, the isolation power supply 110 is operated only when the cell balancing operation is performed, thereby minimizing power consumption.

As shown in FIG. 1, a control switch CS may be further provided between a (+) terminal B+(or a positive end terminal) of all the battery cells and a (+) terminal at the input terminal (see "A" in FIG. 1) of the isolation power supply 110. In a case where the cell balancing operation is not performed, the coupling between the battery cells and the isolation power supply 110 may be cut off by turning off the control switch CS. Accordingly, the power consumption can be further reduced.

As described above, in the cell balancing operation according to this embodiment, the battery cell having a lower voltage is charged using the total voltage of the battery cells. In one embodiment, the isolation power supply 110 outputs the charging voltage at least until the low voltage battery cell is charged with the reference voltage or the voltage of the low battery cell becomes substantially the same as the voltage of at least one of the remaining battery cells. The controller 120 may control the isolation power supply 110 with respect to the time period during which the isolation power supply 110 outputs the charging voltage.

In one embodiment, as shown in FIG. 2, the isolation power supply 110 receives the total voltage of the battery cells, applied to the input stage A thereof, and adjusts the turn ratio of a coil-type transformer 112 using an induced electromotive force, provided in the isolation power supply 110, or controls a switching time through a power controller 114 provided in the isolation power supply 110. Accordingly, the isolation power supply 110 converts the input total voltage into a predetermined voltage and provides the converted predetermined voltage to a corresponding battery cell coupled to the output terminal B. In one embodiment, the power controller (114) includes plural switch devices (like full bridge type switch devices) to control on/off operations such that the total voltage of the battery cells which is input at the input stage (A) is converted to an AC voltage which is provided to the transformer (112).

Capacitors 116 respectively formed at the input and output terminals A and B perform the function of stabilization capacitors, and diodes 118 provided at the output terminal B perform the function of preventing reverse current from the output terminal B. In this embodiment, a separate charger 130 may be further provided between the isolation power supply 110 and the pair of switches.

The charger 130 may be implemented as a DC/DC converter. The charger 130 may receive a voltage (the converted predetermined voltage) output from the isolation power supply 110 as an input voltage Vin, convert the received voltage into a voltage suitable for a battery cell to be charged and output the converted voltage as an output voltage Vout. In one embodiment, Vout is less than the converted predetermined voltage. In another embodiment, there is a linear relationship between Vout and the converted predetermined voltage (for example, 3 volt and 9 volt, respectively).

In one embodiment, if the total voltage of the battery cells is about 30V, the isolation power supply 110 receives about 30V and outputs about 5V. The voltage output from the isolation power supply 110 is applied as the input voltage Vin of the charger 130. However, the output voltage of the isolation power supply 110 may be changed depending on specifications of the charger 130.

The output voltage Vout of the charger 130, used when a specific battery cell is charged, may be, for example, about 4.2V. The output voltage Vout of the charger 130 may be a voltage lower than about 4.2V according to the cell balancing operation. For example, in a case where the cell balancing operation is an operation of comparing voltages of the battery cells based on a reference value of about 3.5V, the output voltage Vout of the charger 130 may be set to about 3.5V as the charging voltage. In this case, the output voltage Vout of the charger 130 is not always output at a fixed level.

In one embodiment, the isolation power supply 110 receives the total voltage applied from the battery cells, but a ground voltage different from that of the battery cells is used so that the isolation power supply 110 as an isolated power source performs the function of providing the charging voltage to the specific battery cell.

In this embodiment, a first ground voltage GND1 coupled to a (−) terminal B− (or a negative end terminal) of all the battery cells and a second ground voltage GND2 coupled to a (−) terminal at the output terminal B of the isolation power supply 110 are physically separated so as not to be coupled to each other.

As such, the different ground voltages are used to prevent the situation in which the battery cells are short-circuited when the cell balancing operation is performed.

For example, if the first and second ground voltages GND1 and GND2 are used as the same ground voltage through the same coupling line, the second ground voltage GND2 applied to the (−) terminal of the first battery cell B1 in the cell balancing operation of the first battery cell B1 is identical to the first ground voltage GND1 applied to the (+) terminal of the second battery cell B2 and the (−) terminal of the third battery cell B3, which are coupled to the same node, and therefore, the battery cells may be exploded.

FIG. 3 is a flowchart illustrating a cell balancing method according to an embodiment. Depending on the embodiment, additional states may be added, others removed, or the order of the states changes in FIG. 3.

The cell balancing method according to this embodiment will be described with reference to FIGS. 1 to 3.

First, the pairs of switches SW1-1 and SW1-2, SW2-1 and SW2-2, and SW3-1 and SW3-2 respectively coupled to the (+) and (−) terminals of the battery cells B1, B2 and B3 coupled in series are sequentially turned on so that the voltage of each battery cell is sensed (ST300).

In one embodiment, the pair of switches coupled to each battery cell are independently operated, and the (1-1)th and (1-2)th switches SW1-1 and SW1-2 corresponding to the first battery cell B1 are simultaneously turned on/off. Accordingly, the pair of switches SW1-1 and SW2-2 are turned on, so that the voltage of the first battery cell B1 can be sensed.

The (2-1)th and (2-2)th switches SW2-1 and SW2-2 corresponding to the second battery cell B2 and the (3-1)th and (3-2)th switches SW3-1 and SW3-2 corresponding to the third battery cell B3 perform the same operation described above.

That is, the controller 120 sequentially turns on the pairs of switches SW1-1 and SW1-2, SW2-1 and SW2-2, and SW3-1 and SW3-2 during a voltage measuring period, so that it is possible to measure a voltage of each battery cell B1, B2 or B3 corresponding to the pair of switches.

Next, the measured voltage of each battery cell is transferred to the controller 120 so as to be compared with a predetermined reference value. In a case where the voltage of a specific battery cell is lower than the reference value, a cell balancing operation is performed in which a charging voltage is applied to the battery cell (ST310).

For example, in a case where the voltage of the first battery cell B1 is lower than the reference value, the (1-1)th and (1-2)th switches SW1-1 and SW1-2 are turned on so that the (+) and (−) terminals of the first battery cell B1 are coupled to the output terminal of the isolation power supply 110. Accordingly, the charging voltage output from the isolation power supply 110 is applied to the first battery cell B1

In one embodiment, while the cell balancing operation is performed in which the charging voltage is applied to the first battery cell B1, all the switches coupled to the second and third battery cells B2 and B3 are turned off so that the charging voltage is not applied to the other battery cells B2 and B3.

The cell balancing operation is implemented by charging the battery cell having a low voltage using the total voltage of the battery cells (ST320).

That is, the isolation power supply 110 that receives the total voltage of the battery cells coupled in series applies the charging voltage to the battery cell having a voltage lower than the reference value, thereby implementing the cell balancing operation.

According to at least one of the disclosed embodiments, the cell balancing circuit has an isolation power supply that receives the cumulative voltage of a plurality of battery cells coupled in series, and a charging voltage is applied to the battery cell having a voltage lower than a reference value through the isolation power supply, so that it is possible to implement a cell balancing operation using the total voltage of the battery cells. Further, there is no heat consumption caused through forcible discharging, and thus it is possible to use 100% of the capacity of the battery cells.

While the above embodiments have been described in connection with the accompanying drawings, it is to be understood that the present disclosure is not limited to the disclosed embodiments, but, on the contrary, is intended to cover various modifications and equivalent arrangements included within the spirit and scope of the appended claims, and equivalents thereof.

What is claimed is:

1. A battery cell balancing system, comprising:
a plurality of battery cells arranged in series; and
a power supply configured to receive the cumulative voltage of the battery cells and output a first charging voltage to one of the battery cells that has a voltage less than a reference voltage,
wherein the power supply comprises:
first and second input terminals respectively connected to a positive end terminal and a negative end terminal of the battery cells; and
an output terminal disposed on the opposite side of the first and second input terminals and selectively connected to at least one of the battery cells.

2. The system of claim 1, further comprising a plurality of switches respectively connected between positive and negative terminals of each of the battery cells, wherein each switch pair is configured to be selectively turned on, and wherein the power supply is further configured to provide the first charging voltage to the battery cell via the turned-on switch pair.

3. The system of claim 2, wherein each switch is separated from the remaining switches.

4. The system of claim 2, wherein the output terminal of the power supply selectively connected to the at least one of the battery cells through the switches.

5. The system of claim 4, further comprising a control switch disposed between 1) one of the positive and negative end terminals and 2) one of the first and second input terminals of the power supply.

6. The system of claim 4, further comprising a charger electrically connected to the switches and the output terminal of the power supply, wherein the charger is configured to receive the first charging voltage from the power supply and convert the received voltage into a second charging voltage.

7. The system of claim 6, wherein the first charging voltage is greater than the second charging voltage.

8. The system of claim 4, further comprising:
a first ground voltage source electrically connected to the negative end terminal of the battery cells; and
a second ground voltage source different from the first ground voltage source and electrically connected to the negative terminal of each of the battery cells.

9. The system of claim 1, wherein the power supply further comprises a coil-type transformer, and wherein the power supply is configured to adjust the turn ratio of the transformer such that the received voltage is converted into the first charging voltage.

10. The system of claim 2, further comprising a controller configured to determine the battery cell that has a voltage less than the reference voltage and control the switches such that a switches coupled between the positive and negative terminals of the determined battery cell is turned on and the remaining switches are turned off.

11. The system of claim 10, wherein the controller is further configured to measure voltages of the battery cells and compare the measured voltages with the reference voltage which has been previously stored in order to determine the under voltage battery cell.

12. The system of claim 10, wherein the controller is further configured to simultaneously turn on and turn off each of the switches.

13. The system of claim 10, wherein the controller is further configured to independently operate each of the switches from the remaining switches.

14. The system of claim 10, wherein the controller is further configured to provide an enable signal to the power supply such that the power supply outputs the first charging voltage only while receiving the enable signal.

15. The system of claim 1, wherein the power supply is configured to output the charging voltage at least until the at least one battery cell is charged with the reference voltage.

16. A battery pack voltage balancer, comprising:
a plurality of switches respectively connected between positive and negative terminals of each of a plurality of battery cells within a battery pack, wherein each of the switches is configured to be selectively turned on; and
a power supply configured to receive the cumulative voltage of the battery cells and provide a first charging voltage to one of the battery cells that has a voltage less than a reference voltage via a turned-on switch,
wherein the power supply comprises:
first and second input terminals respectively connected to a positive end terminal and a negative end terminal of the battery cells; and
an output terminal disposed on the opposite side of the first and second input terminals and connected to the switches.

17. The balancer of claim 16, further comprising a controller configured to determine the battery cell that has a voltage less than the reference voltage and control the switches such that a switch coupled between the positive and negative terminals of the determined battery cell are turned on and the remaining switches are turned off.

18. A battery cell balancing method, comprising:
receiving the cumulative voltage of a plurality of battery cells coupled in series through first and second input terminals respectively connected to a positive end terminal and a negative end terminal of the battery cells;
converting the received cumulative voltage to a first charging voltage; and providing the first charging voltage to one of the battery cells that has a voltage less than a reference voltage through an output terminal disposed on the opposite side of the first and second input terminals and selectively connected to the batter cells.

19. The method of claim 18, further comprising:
measuring a voltage of each of the battery cells;
comparing the measured voltages with a previously stored reference voltage; and
determining the low voltage battery cell based on the comparing.

20. The method of claim 19, further comprising providing a plurality of pairs of switches each switch pair respectively coupled to the battery cells and sequentially turning on the pairs of the switches, wherein the measuring is performed while the switches are turned on.

* * * * *